United States Patent
Kong et al.

(10) Patent No.: US 9,660,617 B2
(45) Date of Patent: May 23, 2017

(54) SEMICONDUCTOR APPARATUS

(71) Applicant: SK hynix Inc., Icheon-si, Gyeonggi-do (KR)

(72) Inventors: Kyu Bong Kong, Icheon-si (KR); Geun Il Lee, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 129 days.

(21) Appl. No.: 14/665,957

(22) Filed: Mar. 23, 2015

(65) Prior Publication Data
US 2016/0164501 A1    Jun. 9, 2016

(30) Foreign Application Priority Data
Dec. 5, 2014   (KR) .................. 10-2014-0174467

(51) Int. Cl.
| G11C 7/00 | (2006.01) |
| H03K 3/037 | (2006.01) |
| H03K 21/02 | (2006.01) |
| G11C 7/10 | (2006.01) |

(52) U.S. Cl.
CPC ......... *H03K 3/0375* (2013.01); *H03K 21/026* (2013.01); *G11C 7/1039* (2013.01); *G11C 7/1087* (2013.01); *G11C 7/1093* (2013.01)

(58) Field of Classification Search
None
See application file for complete search history.

(56) References Cited

U.S. PATENT DOCUMENTS

| 9,287,855 B2 * | 3/2016 | Ku ................. G11C 7/1087 |
| 2006/0104126 A1 * | 5/2006 | Park ................. G11C 7/1066 365/189.05 |

FOREIGN PATENT DOCUMENTS

KR   1020050079539 A   10/2005

* cited by examiner

*Primary Examiner* — Tuan T Lam
(74) *Attorney, Agent, or Firm* — William Park & Associates Ltd.

(57) ABSTRACT

A semiconductor apparatus includes a pipe input/output signal generation block configured to generate a plurality of pipe input signals and a plurality of pipe output signals according to a pipe enable signal, and be initialized according to an error detection signal; a pipe latch group including a plurality of pipe latches, each of the plurality of pipe latches being configured to receive and store an input signal according to a corresponding pipe input signal and output a stored signal as an output signal according to a corresponding pipe output signal; and an error detection block configured to generate the error detection signal according to a pipe end signal, the pipe enable signal, the plurality of pipe input signals and the plurality of pipe output signals.

17 Claims, 4 Drawing Sheets

SEMICONDUCTOR APPARATUS

CROSS-REFERENCES TO RELATED APPLICATION

The present application claims priority under 35 U.S.C. §119(a) to Korean application number 10-2014-0174467, filed on Dec. 5, 2014, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus receives an electrical signal, performs an operation corresponding to the received electrical signal, and outputs a result of the performed operation as an electrical signal.

A semiconductor apparatus is configured to transmit and receive electrical signals to and from another semiconductor apparatus or a controller.

As a semiconductor apparatus operates at a high speed, in order to process a large amount of information at a time, the semiconductor apparatus is configured to include a pipe latch circuit.

The pipe latch circuit is a circuit which is configured to store a plurality of input signals at desired timings and output a plurality of output signals at desired timings, and is included in a semiconductor apparatus. The pipe latch circuit may perform transmission and reception of signals between internal circuits or between an external device of the semiconductor apparatus and an internal circuit of the semiconductor apparatus, on the basis of large capacity.

SUMMARY

In an embodiment, a semiconductor apparatus may include a pipe input/output signal generation block configured to generate a plurality of pipe input signals and a plurality of pipe output signals according to a pipe enable signal, and be initialized according to an error detection signal. The semiconductor apparatus may also include a pipe latch group including a plurality of pipe latches, each of the plurality of pipe latches being configured to receive and store an input signal according to a corresponding pipe input signal and output a stored signal as an output signal according to a corresponding pipe output signal. The semiconductor apparatus may also include an error detection block configured to generate the error detection signal according to a pipe end signal, the pipe enable signal, the plurality of pipe input signals and the plurality of pipe output signals.

In an embodiment, a semiconductor apparatus may include a pipe input/output signal generation block configured to sequentially enable a plurality of pipe input signals and a plurality of pipe output signals according to a read signal, and be initialized according to an error detection signal. The semiconductor apparatus may also include a pipe latch group configured to receive and store data according to a pipe input signal enabled among the plurality of pipe input signals, and output stored data as an output signal according to a pipe output signal enabled among the plurality of pipe output signals. The semiconductor apparatus may also include and an error detection block configured to generate the error detection signal according to a precharge signal, the read signal, the plurality of pipe input signals and the plurality of pipe output signals.

In an embodiment, a semiconductor apparatus may include a pipe input/output signal generation block configured to generate first to fourth pipe input signals and first to fourth pipe output signals according to a pipe enable signal and be initialized according to an error detection signal. The semiconductor apparatus may also include a pipe latch group configured to receive and store an input signal according to the first to fourth input signals and output the stored signal as an output signal according to the first to fourth pipe output signals. The semiconductor apparatus may also include an error detection block configured to generate the error detection signal according to the pipe enable signal, a pipe end signal, the first to fourth pipe input signals and the first to fourth pipe output signals.

DETAILED DESCRIPTION

Hereinafter, a semiconductor apparatus will be described below with reference to the accompanying figures through various embodiments.

Figure 1:
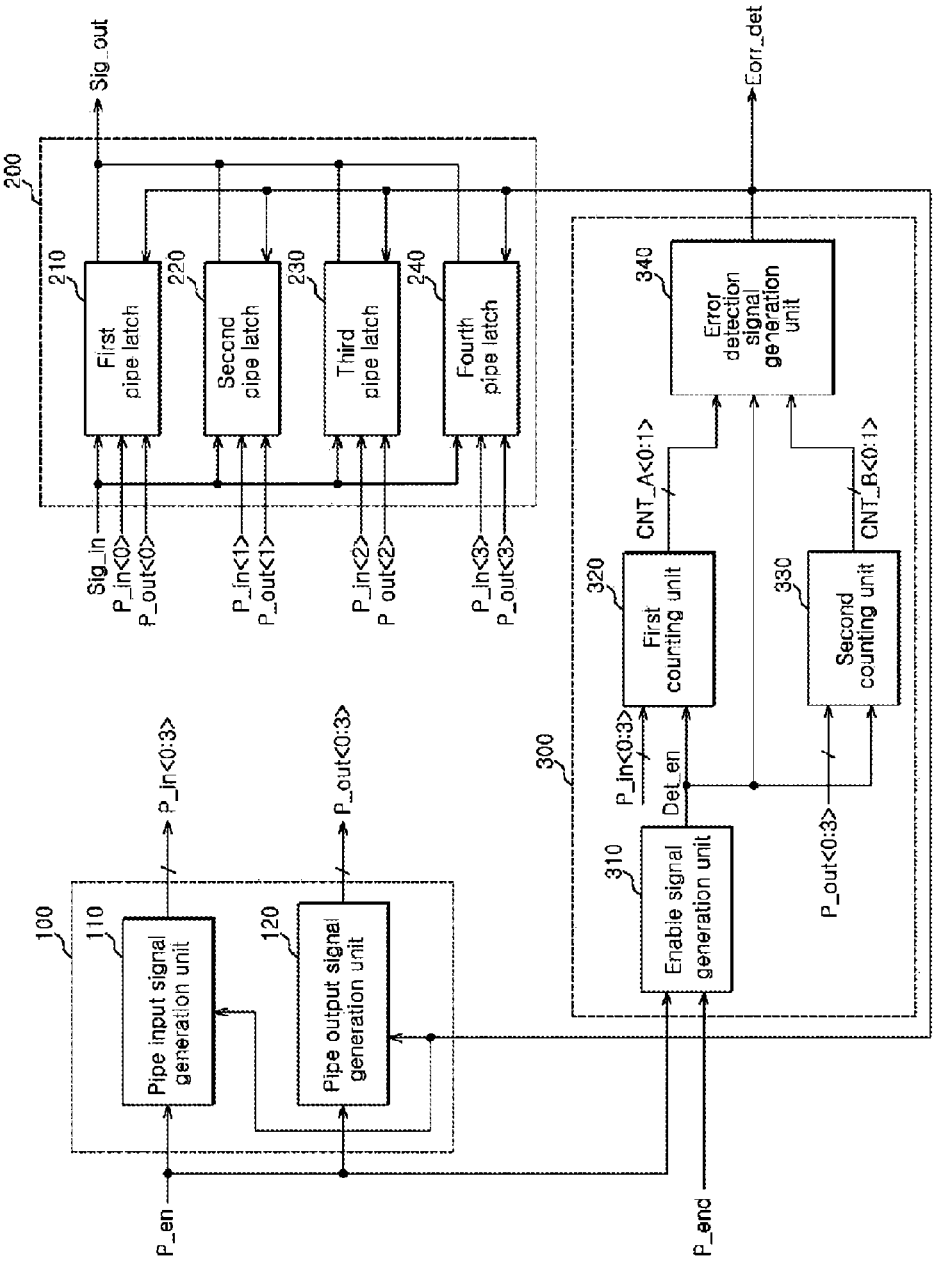
FIG. 1 is a configuration diagram illustrating a representation of an example of a semiconductor apparatus in accordance with an embodiment.

Referring to FIG. 1, a semiconductor apparatus in accordance with an embodiment includes a pipe input/output signal generation block 100, a pipe latch group 200, and an error detection block 300.

The pipe input/output signal generation block 100 generates first to fourth pipe input signals P_in<0:3> and first to fourth pipe output signals P_out<0:3> according to a pipe enable signal P_en. The pipe input/output signal generation block 100 is initialized in response to an error detection signal Eorr_det. For example, when the pipe enable signal P_en is enabled, the pipe input/output signal generation block 100 sequentially enables the first to fourth pipe input signals P_in<0:3>. Further, the pipe input/output signal generation block 100 sequentially enables the first to fourth pipe output signals P_out<0:3> corresponding to the first to fourth pipe input signals P_in<0:3> after a preset time has passed from when the first to fourth pipe input signals P_in<0:3> are sequentially enabled. More specifically, when the pipe enable signal P_en is enabled, the pipe input/output signal generation block 100 enables the first pipe input signal P_in<0>. Moreover, the pipe input/output signal generation block 100 enables the first pipe output signal P_out<0> after the preset time has passed from when the first pipe input signal P_in<0> is enabled. In addition, after the first pipe input signal P_in<0> is enabled, the pipe input/output signal generation block 100 enables the second pipe input signal P_in<1>, and enables the second pipe output signal P_out<1> after the preset time has passed from when the second pipe input signal P_in<1> is enabled. In particular, when the pipe enable signal P_en is enabled, the pipe input/output signal generation block 100 sequentially enables the first to fourth pipe input signals P_in<0:3>. Further, the pipe input/output signal generation block 100 sequentially enables the first to fourth pipe output signals P_out<0:3> after the preset time has passed from when the first to fourth pipe input signals P_in<0:3> are sequentially enabled. When the error detection signal Eorr_det is enabled, the pipe input/output signal generation block 100 is initialized and initializes the first to fourth pipe input signals P_in<0:3> and the first to fourth pipe output signals P_out<0:3>.

The pipe input/output signal generation block 100 includes a pipe input signal generation unit 110 and a pipe output signal generation unit 120.

The pipe input signal generation unit 110 sequentially enables the first to fourth pipe input signals P_in<0:3> when the pipe enable signal P_en is enabled. The pipe input signal generation unit 110 is initialized and disables all the first to fourth pipe input signals P_in<0:3> when the error detection signal Eorr_det is enabled.

The pipe output signal generation unit 120 sequentially enables the first to fourth pipe output signals P_out<0:3> when the preset time has passed after the pipe enable signal P_en is enabled. The pipe output signal generation unit 120 is initialized. In addition, the pipe output signal generation unit 120 disables all the first to fourth pipe output signals P_out<0:3> when the error detection signal Eorr_det is enabled.

The pipe latch group 200 receives and stores an input signal Sig_in according to the first to fourth pipe input signals P_in<0:3>. The pipe latch group 200 also outputs the stored signal as an output signal Sig_out in response to the first to fourth pipe output signals P_out<0:3>. The pipe latch group 200 is initialized according to the error detection signal Eorr_det.

The pipe latch group 200 includes first to fourth pipe latches 210, 220, 230 and 240.

The first pipe latch 210 receives and stores the input signal Sig_in in response to the first pipe input signal P_in<0>. The first pipe latch 210 also outputs the stored signal as the output signal Sig_out in response to the first pipe output signal P_out<0>. For example, the first pipe latch 210 receives and stores the input signal Sig_in when the first pipe input signal P_in<0> is enabled. The pipe latch 210 also outputs the stored signal as the output signal Sig_out when the first pipe output signal P_out<0> is enabled.

The second pipe latch 220 receives and stores the input signal Sig_in in response to the second pipe input signal P_in<1>. The second pipe latch 220 also outputs the stored signal as the output signal Sig_out in response to the second pipe output signal P_out<1>. For example, the second pipe latch 220 receives and stores the input signal Sig_in when the second pipe input signal P_in<1> is enabled. Further, the second pipe latch 220 outputs the stored signal as the output signal Sig_out when the second pipe output signal P_out<1> is enabled.

The third pipe latch 230 receives and stores the input signal Sig_in in response to the third pipe input signal P_in<2>. The third pipe latch 230 also outputs the stored signal as the output signal Sig_out in response to the third pipe output signal P_out<2>. For example, the third pipe latch 230 receives and stores the input signal Sig_in when the third pipe input signal P_in<2> is enabled. The third pipe latch 230 also outputs the stored signal as the output signal Sig_out when the third pipe output signal P_out<2> is enabled.

The fourth pipe latch 240 receives and stores the input signal Sig_in in response to the fourth pipe input signal P_in<3>. Further, the fourth pipe latch 240 also outputs the stored signal as the output signal Sig_out in response to the fourth pipe output signal P_out<3>. For example, the fourth pipe latch 240 receives and stores the input signal Sig_in when the fourth pipe input signal P_in<3> is enabled. The fourth pipe latch 240 also outputs the stored signal as the output signal Sig_out when the fourth pipe output signal P_out<4> is enabled.

The respective first to fourth pipe latches 210, 220, 230 and 240 are initialized when the error detection signal Eorr_det is enabled. For example, the respective first to fourth pipe latches 210, 220, 230 and 240 reset (initialize) all stored signals when the error detection signal Eorr_det is enabled.

The error detection block 300 generates the error detection signal Eorr_det according to the pipe enable signal P_en, a pipe end signal P_end, the first to fourth pipe input signals P_in<0:3> and the first to fourth pipe output signals P_out<0:3>. For example, the error detection block 300 compares the number of the pipe input signals enabled among the first to fourth pipe input signals P_in<0:3> and the number of the pipe output signals enabled among the first to fourth pipe output signals P_out<0:3> from after the pipe enable signal P_en is enabled to until the pipe end signal P_end is enabled. In addition, the error detection block 300 generates the error detection signal Eorr_det. More specifically, the error detection block 300 enables the error detection signal Eorr_det if the number of the pipe input signals enabled among the first to fourth pipe input signals P_in<0:3> and the number of the pipe output signals enabled among the first to fourth pipe output signals P_out<0:3> from after the pipe enable signal P_en is enabled to until the pipe end signal P_end is enabled are different from each other. Further, the error detection block 300 disables the error detection signal Eorr_det if they are equal to each other.

The error detection block 300 includes an enable signal generation unit 310, a first counting unit 320, a second counting unit 330, and an error detection signal generation unit 340.

The enable signal generation unit 310 generates a detection enable signal Det_en enabled when the pipe enable signal P_en is enabled and is disabled when the pipe end signal P_end is enabled.

The first counting unit 320 generates first counting codes CNT_A<0:1> corresponding to the number of the pipe input signals enabled among the first to fourth pipe input signals P_in<0:3> during a period in which the detection enable signal Det_en is enabled. For example, the first counting unit 310 counts the pipe input signals enabled among the first to fourth pipe input signals P_in<0:3> during the period in which the detection enable signal Det_en is enabled. The first counting unit 310 also generates the first counting codes CNT_A<0:1>.

The second counting unit 330 generates second counting codes CNT_B<0:1> corresponding to the number of the pipe output signals enabled among the first to fourth pipe output signals P_out<0:3> during the period in which the detection enable signal Det_en is enabled. For example, the second counting unit 330 counts the pipe output signals enabled among the first to fourth pipe output signals P_out<0:3> during the period in which the detection enable signal Det_en is enabled. The second counting unit 330 also generates the second counting codes CNT_B<0:1>.

The error detection signal generation unit 340 compares the first and second counting codes CNT_A<0:1> and CNT_B<0:1> and generates the error detection signal Eorr_det. For example, the error detection signal generation unit 340 outputs a result of comparing the first counting codes CNT_A<0:1> and the second counting codes CNT_B<0:1>, as the error detection signal Eorr_det, when the detection enable signal Det_en is disabled. In particular, the error detection signal generation unit 340 enables the error detection signal Eorr_det if the first and second counting codes CNT_A<0:1> and CNT_B<0:1> are different from each other and disables the error detection signal Eorr_det if the first and second counting codes CNT_A<0:1> and CNT_B<0:1> are the same with each other, when the detection enable signal Det_en is disabled.

Figure 2:
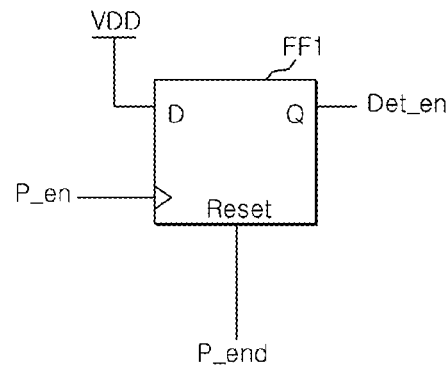
FIG. 2 is a configuration diagram illustrating a representation of an example of the enable signal generation unit shown in FIG. 1.

Referring to FIG. 2, the enable signal generation unit 310 includes a first flip-flop FF1. The first flip-flop FF1 receives an external voltage VDD through an input terminal, receives the pipe enable signal P_en through a clock input terminal, and receives the pipe end signal P_end through a reset terminal. The first flip-flop FF1 also outputs the detection enable signal Det_en through an output terminal. For example, the first flip-flop FF1 outputs the external voltage VDD as the voltage level of the detection enable signal Det_en, when the pipe enable signal P_en is enabled, that is, the pipe enable signal P_en is enabled to a high level, and thereby, enables the detection enable signal Det_en. The first flip-flop FF1 receives the pipe end signal P_end through the reset terminal. The first flip-flop FF1 also disables the enabled detection enable signal Det_en when the pipe end signal P_end is enabled. As a result, the enable signal generation unit 310 generates the detection enable signal Det_en which retains the enabled state from after the pipe enable signal P_en is enabled to until the pipe end signal P_end is enabled.

The error detection signal generation unit 340 outputs a result of comparing the first and second counting codes CNT_A<0:1> and CNT_B<0:1>, as the error detection signal Eorr_det, when the detection enable signal Det_en is disabled.

Figure 3:
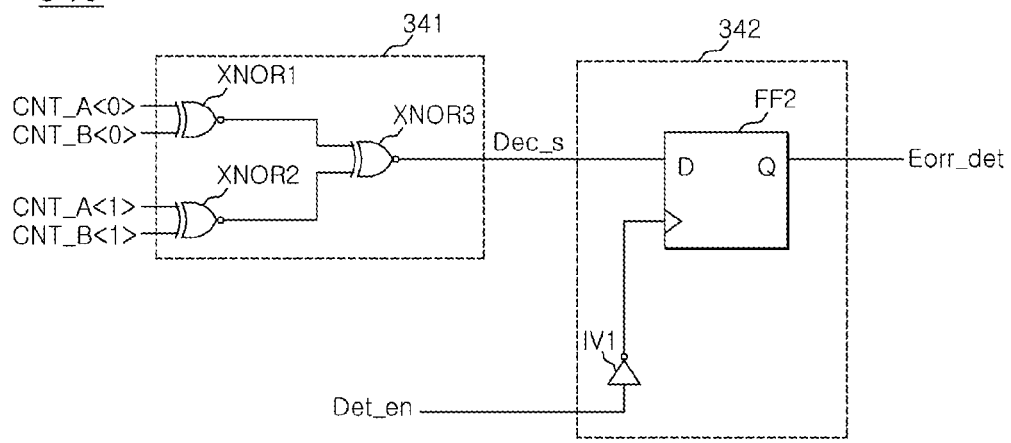
FIG. 3 is a configuration diagram illustrating a representation of an example of the error detection signal generation unit shown in FIG. 1.

Referring to FIG. 3, the error detection signal generation unit 340 includes a comparing section 341 and an output section 342 is described.

The comparing section 341 compares the first and second counting codes CNT_A<0:1> and CNT_B<0:1>. The comparing section 341 also outputs a comparison result as a determination signal Dec_s. For example, the comparing section 341 enables the determination signal Dec_s when the first and second counting codes CNT_A<0:1> and CNT_B<0:1> are different from each other. Further, the comparing section 341 disables the determination signal Dec_s when the first and second counting codes CNT_A<0:1> and CNT_B<0:1> are the same.

The comparing section 341 includes first to third exclusive NOR gates XNOR1, XNOR2 and XNOR3. The first exclusive NOR gate XNOR1 receives the respective first bits CNT_A<0> and CNT_B<0> of the first and second counting codes CNT_A<0:1> and CNT_B<0:1>. The second exclusive NOR gate XNOR2 receives the respective second bits CNT_A<1> and CNT_B<1> of the first and second counting codes CNT_A<0:1> and CNT_B<0:1>. The third exclusive NOR gate XNOR3 receives the output signals of the first and second exclusive NOR gates XNOR1 and XNOR2. The third exclusive NOR gate XNOR3 also outputs the determination signal Dec_s.

The output section 342 outputs the determination signal Dec_s of when the detection enable signal Det_en is disabled, as the error detection signal Eorr_det.

The output section 342 includes an inverter IV1 and a second flip-flop FF2. The inverter IV1 receives the detection enable signal Det_en. The second flip-flop FF2 receives the determination signal Dec_s through an input terminal. The second flip-flop FF2 also receives the output of the inverter IV1 through a clock input terminal, and outputs the error detection signal Eorr_det through an output terminal.

Operations of the semiconductor apparatus in accordance with an embodiment, configured as mentioned above, will be described below.

The pipe input signal generation unit 110 sequentially enables the first to fourth pipe input signals P_in<0:3> when the pipe enable signal P_en is enabled.

The pipe output signal generation unit 120 sequentially enables the first to fourth pipe output signals P_out<0:3> when the preset time has passed after the pipe enable signal P_en is enabled.

In other words, the pipe input/output signal generation block 100 including the pipe input signal generation unit 110 and the pipe output signal generation unit 120 sequentially enables the first to fourth pipe input signals P_in<0:3>. Further, after the preset time has passed, sequentially enables the first to fourth pipe output signals P_out<0:3> when the pipe enable signal P_en is enabled.

The first pipe latch 210 receives and stores the input signal Sig_in when the first pipe input signal P_in<0> is enabled. The first pipe latch 210 also outputs the stored signal as the output signal Sig_out when the first pipe output signal P_out<0> is enabled.

The second pipe latch 220 receives and stores the input signal Sig_in when the second pipe input signal P_in<1> is enabled. The second pipe latch 220 also outputs the stored signal as the output signal Sig_out when the second pipe output signal P_out<1> is enabled.

The third pipe latch 230 receives and stores the input signal Sig_in when the third pipe input signal P_in<2> is enabled. The third pipe latch 230 also outputs the stored signal as the output signal Sig_out when the third pipe output signal P_out<2> is enabled.

The fourth pipe latch 240 receives and stores the input signal Sig_in when the fourth pipe input signal P_in<3> is enabled. The fourth pipe latch 240 also outputs the stored signal as the output signal Sig_out when the fourth pipe output signal P_out<3> is enabled.

Namely, the pipe latch group 200 including the first to fourth pipe latches 210, 220, 230 and 240 receives and stores the input signal Sig_in in response to the first to fourth pipe input signals P_in<0:3> which are sequentially enabled. The pipe latch group 200 also outputs the stored signal as the output signal Sig_out in response to the first to fourth pipe output signals P_out<0:3> which are sequentially enabled.

The error detection block 300 compares the number of the pipe input signals enabled among the first to fourth pipe input signals P_in<0:3> and the number of the pipe output signals enabled among the first to fourth pipe output signals P_out<0:3>, when the pipe enable signal P_en is enabled. The error detection block 300 also disables the error detection signal Eorr_det if the numbers are equal to each other and enables the error detection signal Eorr_det if the numbers are different from each other. If the error detection signal Eorr_det is enabled, the pipe input/output signal generation block 100 and the pipe latch group 200 are initialized.

Operations of the error detection block 300 will be described below in detail.

The enable signal generation unit 310 enables the detection enable signal Det_en when the pipe enable signal P_en is enabled. The enable signal generation unit 310 disables the detection enable signal Det_en when the pipe end signal P_end is enabled. In particular, the enable signal generation unit 310 enables the detection enable signal Det_en from after the pipe enable signal P_en is enabled to until the pipe end signal P_end is enabled.

The first counting unit 320 counts the first counting codes CNT_A<0:1> each time the respective first to fourth pipe input signals P_in<0:3> are enabled, during the enable period of the detection enable signal Det_en, that is, from after the pipe enable signal P_en is enabled to until the pipe end signal P_end is enabled. In other words, the first counting unit 320 generates the first counting codes CNT_A<0:1> corresponding to the number of the pipe input signals enabled among the first to fourth pipe input signals P_in<0:3> during the enable period of the detection enable signal Det_en.

The second counting unit 330 counts the second counting codes CNT_B<0:1> each time the respective first to fourth pipe output signals P_out<0:3> are enabled, during the enable period of the detection enable signal Det_en, or, from after the pipe enable signal P_en is enabled to until the pipe end signal P_end is enabled. In other words, the second counting unit 330 generates the second counting codes CNT_B<0:1> corresponding to the number of the pipe output signals enabled among the first to fourth pipe output signals P_out<0:3> during the enable period of the detection enable signal Det_en.

The error detection signal generation unit 340 compares whether the first and second counting codes CNT_A<0:1> and CNT_B<0:1> are the same with each other. The error detection signal generation unit 340 also outputs a comparison result as the error detection signal Eorr_det when the detection enable signal Det_en is disabled. For example, the error detection signal generation unit 340 outputs the enabled error detection signal Eorr_det if the first and second counting codes CNT_A<0:1> and CNT_B<0:1> are different from each other, when the detection enable signal Det_en is disabled. The error detection signal generation unit 340 outputs the disabled error detection signal Eorr_det if the first and second counting codes CNT_A<0:1> and CNT_B<0:1> are the same with each other, when the detection enable signal Det_en is disabled. If the error detection signal Eorr_det is enabled, the pipe input/output signal generation block 100 and the pipe latch group 200 are all initialized.

In a semiconductor apparatus including a pipe latch group which performs a normal operation, each of the plurality of pipe latches included in the pipe latch group receive and store an input signal when a pipe input signal is enabled. The plurality of pipe latches also and output the stored signal as an output signal when a pipe output signal is enabled. In particular, in the semiconductor apparatus which performs a normal operation, it is determined that the semiconductor apparatus operates normally, only when the number of the pipe input signals enabled among a plurality of pipe input signals for controlling the plurality of pipe latches and the number of the pipe output signals enabled among a plurality of pipe output signals for controlling the plurality of pipe latches are equal to each other. If the number of the pipe input signals enabled among the plurality of pipe input signals and the number of the pipe output signals enabled among the plurality of pipe output signals are different from each other, it is determined that the semiconductor apparatus does not operate normally. The reason to this resides in that, since each of the plurality of pipe latches is configured to receive and store an input signal in response to a pipe input signal and output the stored signal according to a pipe output signal, all the signals received and stored by the pipe input signals should be outputted by the pipe output signals.

Figure 4:
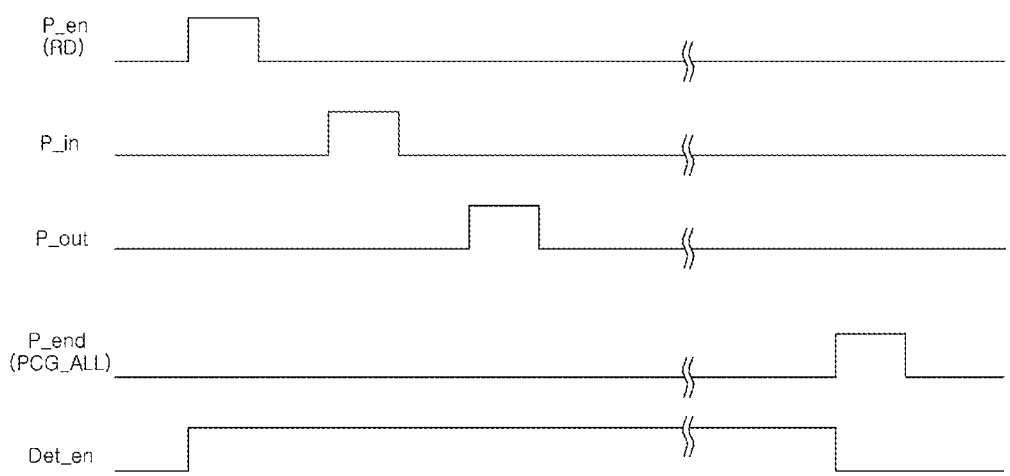
FIG. 4 is a representation of an example of a timing diagram to assist in the explanation of the semiconductor apparatus in accordance with an embodiment.

Although a pipe input/output signal generation block which generates the plurality of pipe input signals and the plurality of pipe output signals is configured such that the number of enabled pipe input signals and the number of enabled pipe output signals are equal to each other, the pipe input/output signal generation block may mis-operate according to the circumstances of the semiconductor apparatus including a temperature variation, a voltage variation, a process variation, noise, and so forth. Therefore, where the number of enabled pipe input signals and the number of enabled pipe output signals are not equal, by initializing the pipe input/output signal generation block which generates the plurality of pipe input signals and the plurality of pipe output signals such that the number of enabled pipe input signals and the number of enabled pipe output signals become equal to each other when a next operation is performed, the semiconductor apparatus may detect, determine and correct an abnormal operation by itself. As a result, the reliability of the semiconductor apparatus may be improved.

Where such a semiconductor apparatus in accordance with an embodiment is used for a read operation, the pipe enable signal P_en of FIG. 1 may be replaced with a read signal RD (see FIG. 4). In addition, the pipe end signal P_end of FIG. 1 may be replaced with a precharge signal PCG_ALL (see FIG. 4). Further, the input signal Sig_in inputted to the pipe latch group 200 may be replaced with data. The read signal RD is a signal for causing the data stored in a data storage circuit to be outputted. Moreover, the precharge signal PCG_ALL is a signal for precharging the circuits used in a read operation after the read operation is completed such that a next read operation may be normally performed.

Operations where the semiconductor apparatus in accordance with an embodiment is used in a read operation will be described below.

The pipe input/output signal generation block 100 sequentially enables the first to fourth pipe input signals P_in<0:3> and the first to fourth pipe output signals P_out<0:3> in response to the read signal RD. The pipe input/output signal generation block 100 is also initialized according to the error detection signal Eorr_det.

The pipe latch group 200 receives and stores data Sig_in in response to the pipe input signals enabled among the first to fourth pipe input signals P_in<0:3>. The pipe latch group 200 also outputs the stored data in response to the pipe output signals enabled among the first to fourth pipe output signals P_out<0:3>. In addition, the pipe latch group 200 is initialized in response to the error detection signal Eorr_det.

The error detection block 300 generates the error detection signal Eorr_det in response to the precharge signal PCG_ALL, the read signal RD, the first to fourth pipe input signals P_in<0:3> and the first to fourth pipe output signals P_out<0:3>. For example, the error detection block 300 compares the number of the pipe input signals enabled among the first to fourth pipe input signals P_in<0:3> and the number of the pipe output signals enabled among the first to fourth pipe output signals P_out<0:3>. The error detection block 300 also generates the error detection signal Eorr_det.

The error detection block 300 includes the enable signal generation unit 310, the first counting unit 320, the second counting unit 330, and the error detection signal generation unit 340.

The enable signal generation unit 310 generates the detection enable signal Det_en enabled when the read signal RD is enabled and retains the enabled state until the precharge signal PCG_ALL is enabled.

The first counting unit 320 counts the number of the pipe input signals enabled among the first to fourth pipe input signals P_in<0:3> during the enable period of the detection enable signal Det_en. The first counting unit 320 also generates the first counting codes CNT_A<0:1>.

The second counting unit 330 counts the number of the pipe output signals enabled among the first to fourth pipe output signals P_out<0:3> during the enable period of the detection enable signal Det_en. The second counting unit 330 also generates the second counting codes CNT_B<0:1>.

The error detection signal generation unit 340 disables the error detection signal Eorr_det if the first counting codes CNT_A<0:1> and the second counting codes CNT_B<0:1> are the same with, when the detection enable signal Det_en is disabled. The error detection signal generation unit 340 also enables the error detection signal Eorr_det if the first counting codes CNT_A<0:1> and the second counting codes CNT_B<0:1> are different from each other, when the detection enable signal Det_en is disabled.

The error detection signal generation unit 340 may include the comparing section 341 which compares the first and second counting codes CNT_A<0:1> and CNT_B<0:1> and generates the determination signal Dec_s. The error detection signal generation unit 340 may also include the output section 342 which outputs the determination signal Dec_s as the error detection signal Eorr_det when the detection enable signal Det_en is disabled.

As described above, in the semiconductor apparatus in accordance with an embodiment, the pipe enable signal is replaced with the read signal, the pipe end signal is replaced with the precharge signal. Further, the input signal to be inputted to the pipe latch group is replaced with data. In other words, in the semiconductor apparatus in accordance with an embodiment, in the case of performing a read operation by using the plurality of pipe latches, the normal operation and the abnormal operation of the semiconductor apparatus are determined by comparing the numbers of the enabled pipe input signals and the enabled pipe output signals inputted to the respective pipe latches. Moreover, in the case of the abnormal operation, both the pipe input/output signal generation block which generates the pipe input signals and the pipe output signals and the pipe latch group are initialized such that a normal operation may be performed in a next read operation.

In the semiconductor apparatus in accordance with an embodiment, as may be readily seen from FIG. 4, a normal operation and an abnormal operation are determined by comparing the number of the pipe input signals enabled among the plurality of pipe input signals inputted to the pipe latches and the number of the pipe output signals enabled among the plurality of pipe output signals inputted to the pipe latches during a period in which the pipe latches are used (from after the pipe enable signal P_en is enabled to until the pipe end signal P_end is enabled, or from when the read signal RD is inputted to until the precharge signal PCG_ALL is enabled). More specifically, during the enable period of the detection enable signal Det_en, and according to a determination result, the pipe latches and the circuits which generate signals for controlling the pipe latches are initialized. Accordingly, the semiconductor apparatus may detect, determine and correct an abnormal operation by itself, and the reliability of the semiconductor apparatus may be improved.

Figure 5:
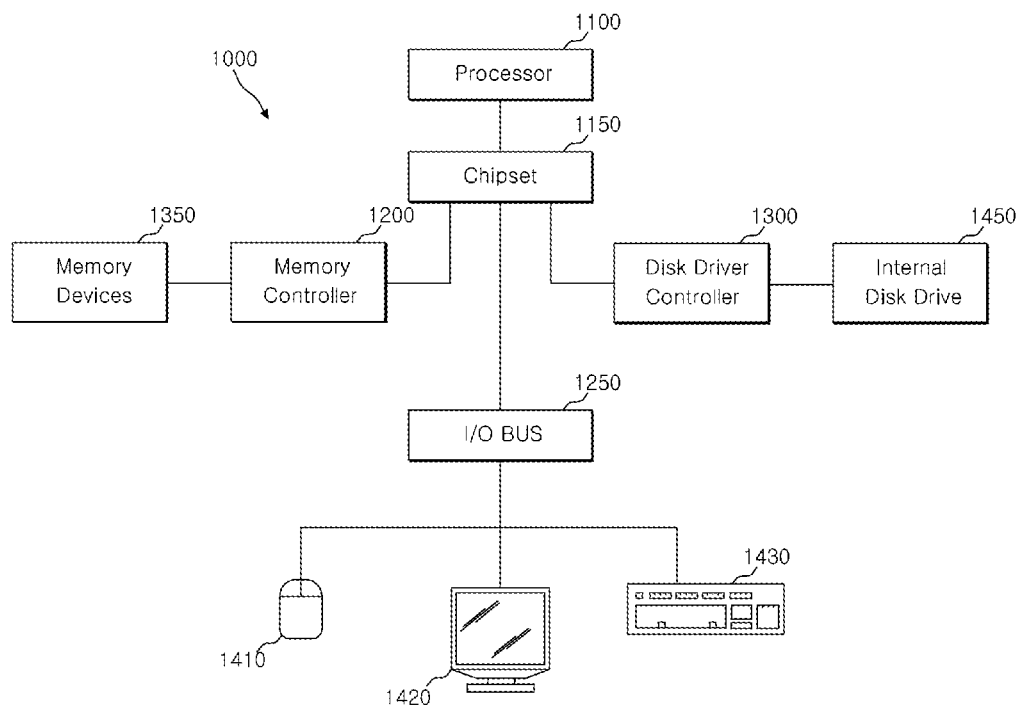
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor apparatus described above.

The chipset 1150 may also be electrically coupled to I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While various embodiments have been described above, it will be understood to those skilled in the art that the embodiments described are by way of example only. Accordingly, the semiconductor apparatus described should not be limited based on the described embodiments above.

What is claimed is:

1. A semiconductor apparatus comprising:
 a pipe input/output signal generation block configured to generate a plurality of pipe input signals and a plurality of pipe output signals according to a pipe enable signal, and be initialized according to an error detection signal;
 a pipe latch group including a plurality of pipe latches, each of the plurality of pipe latches being configured to receive and store an input signal according to a corresponding pipe input signal and output a stored signal as an output signal according to a corresponding pipe output signal; and
 an error detection block configured to generate the error detection signal according to a pipe end signal, the pipe enable signal, the plurality of pipe input signals and the plurality of pipe output signals,
 wherein the error detection block compares a number of pipe input signals enabled among the plurality of pipe input signals and a number of pipe output signals enabled among the plurality of pipe output signals after the pipe enable signal is enabled to until the pipe end signal is enabled, and generates the error detection signal.

2. The semiconductor apparatus according to claim 1, wherein each of the plurality of pipe latches are initialized according to the error detection signal.

3. The semiconductor apparatus according to claim 1, wherein the pipe input/output signal generation block comprises:
a pipe input signal generation unit configured to sequentially enable the plurality of pipe input signals in response to the pipe enable signal; and
a pipe output signal generation unit configured to enable a corresponding pipe output signal among the plurality of pipe output signals, after a preset time has passed, when one of the plurality of pipe input signals is enabled in response to the pipe enable signal.

4. The semiconductor apparatus according to claim 1, wherein the error detection block comprises:
an enable signal generation unit configured to generate a detection enable signal enabled when the pipe enable signal is enabled and is disabled when the pipe end signal is enabled;
a first counting unit configured to generate first counting codes corresponding to the number of pipe input signals enabled among the plurality of pipe input signals during an enable period of the detection enable signal;
a second counting unit configured to generate second counting codes corresponding to the number of pipe output signals enabled among the plurality of pipe output signals during the enable period of the detection enable signal; and
an error detection signal generation unit configured to compare the first and second counting codes, and generate the error detection signal.

5. The semiconductor apparatus according to claim 4, wherein the error detection signal generation unit outputs a result of a comparison of the first and second counting codes as the error detection signal when the detection enable signal is disabled.

6. A semiconductor apparatus comprising:
a pipe input/output signal generation block configured to sequentially enable a plurality of pipe input signals and a plurality of pipe output signals according to a read signal, and be initialized according to an error detection signal;
a pipe latch group configured to receive and store data according to a pipe input signal enabled among the plurality of pipe input signals, and output stored data as an output signal according to a pipe output signal enabled among the plurality of pipe output signals; and
an error detection block configured to generate the error detection signal according to a precharge signal, the read signal, the plurality of pipe input signals and the plurality of pipe output signals,
wherein the error detection block compares a number of pipe input signals enabled among the plurality of pipe input signals and a number of pipe output signals enabled among the plurality of pipe output signals after the read signal is enabled to until the precharge signal is enabled, and generates the error detection signal.

7. The semiconductor apparatus according to claim 6, wherein the error detection block comprises:
an enable signal generation unit configured to generate a detection enable signal enabled when the read signal is enabled and retains an enabled state until the discharge signal is enabled;
a first counting unit configured to count the number of pipe input signals enabled among the plurality of pipe input signals during an enable period of the detection enable signal, and generate first counting codes;
a second counting unit configured to count the number of pipe output signals enabled among the plurality of pipe output signals during the enable period of the detection enable signal, generate second counting codes; and
an error detection signal generation unit configured to disable the error detection signal when the first counting codes and the second counting codes are the same when the detection enable signal is disabled, and enable the error detection signal when the first counting codes and the second counting codes are different and the detection enable signal is disabled.

8. The semiconductor apparatus according to claim 7, wherein the error detection signal generation unit comprises:
a comparing section configured to output a comparison result of the first counting codes and the second counting codes as a determination signal; and
an output section configured to output the determination signal as the error detection signal when the detection enable signal is disabled.

9. A semiconductor apparatus comprising:
a pipe input/output signal generation block configured to generate first to fourth pipe input signals and first to fourth pipe output signals according to a pipe enable signal and be initialized according to an error detection signal;
a pipe latch group configured to receive and store an input signal according to the first to fourth input signals and output the stored signal as an output signal according to the first to fourth pipe output signals; and
an error detection block configured to generate the error detection signal according to the pipe enable signal, a pipe end signal, the first to fourth pipe input signals and the first to fourth pipe output signals,
wherein the error detection block compares a number of pipe input signals enabled among the first to fourth pipe input signals to a number of pipe output signals enabled among the first to fourth pipe output signals when the pipe enable signal is enabled.

10. The semiconductor apparatus according to claim 9, further comprising:
a first counting unit configured to count pipe input signals among the first to fourth pipe input signals to generate first counting codes.

11. The semiconductor apparatus according to claim 10, further comprising:
a second counting unit configured to count pipe output signals enabled among the first to fourth pipe output signals to generate second counting codes.

12. The semiconductor apparatus according to claim 11, further comprising:
an error detection signal generation unit configured to compare the first counting codes to the second counting codes and output a comparison result as the error detection signal.

13. The semiconductor apparatus according to claim 12, wherein the error detection signal generation unit comprises:
a comparing section configured to enable a determination signal when the first counting codes are different from the second counting codes.

14. The semiconductor apparatus according to claim 12, wherein the wherein the error detection signal generation unit comprises:
an output section configured to receive a determination signal and output the error detection signal.

15. The semiconductor apparatus according to claim 9, further comprising:
- a first counting unit configured to generate first counting codes in response to the first to fourth pipe input signals.

16. The semiconductor apparatus according to claim 15, further comprising:
- a second counting unit configured to generate second counting codes in response to the first to fourth pipe output signals.

17. The semiconductor apparatus according to claim 9, further comprising:
- an error detection signal generation unit configured to compare first counting codes to second counting codes and output the error detection signal when the first counting codes are different from the second counting codes.

\* \* \* \* \*